United States Patent [19]

Reynolds

[11] Patent Number: 4,904,419
[45] Date of Patent: Feb. 27, 1990

[54] PROCESS AND APPARATUS FOR VAPOR TRANSFER OF VERY HIGH PURITY LIQUIDS AT HIGH DILUTION

[76] Inventor: Warren D. Reynolds, 3455 Spanish Way, Carlsbad, Calif. 92008

[21] Appl. No.: 322,921

[22] Filed: Mar. 14, 1989

[51] Int. Cl.$^4$ ............................................. B01F 3/04
[52] U.S. Cl. ................................. 261/64.1; 261/121.1
[58] Field of Search ........................... 261/64.1, 121.1

[56] References Cited

U.S. PATENT DOCUMENTS

| | | | |
|---|---|---|---|
| 2,205,559 | 6/1940 | Heftler et al. | 261/121.1 |
| 2,504,009 | 4/1050 | Phillips et al. | 261/121.1 |
| 2,912,018 | 11/1959 | Leech | 261/121.1 |
| 2,981,526 | 4/1961 | Grumbach | 261/121.1 |
| 3,590,902 | 7/1971 | Walker | 261/121.1 |
| 3,766,914 | 10/1973 | Jacobs | 261/121.1 |
| 3,925,033 | 12/1975 | Mayo | 261/121.1 |
| 4,563,312 | 1/1986 | Takimoto et al. | 261/121.1 |
| 4,591,464 | 5/1986 | Kaneno et al. | 261/121.1 |

FOREIGN PATENT DOCUMENTS

| | | | |
|---|---|---|---|
| 518851 | 4/1953 | Belgium | 261/121.1 |
| 62-247521 | 10/1987 | Japan | 261/121.1 |

Primary Examiner—Tim Miles
Attorney, Agent, or Firm—Richard C. Litman

[57] ABSTRACT

By the present invention, a high purity liquid is vapor transported by a carrier gas from a bubbler system at room temperature. The bubbler system uses a split flow path for developing a predetermined high dilution ratio without the need for refrigeration. The quartz inner chamber containing the liquid is contained within and protected by a sturdy outer chamber. Two valves control the bubbler system and allow the internals of the system to be purged of all moisture and impurities before operative use. The lengths and diameters of the flow path tubes are calibrated to enable development of a highly diluted, predetermined vapor-to-carrier-gas ratio for a given total flow rate of carrier gas.

17 Claims, 2 Drawing Sheets

PROCESS AND APPARATUS FOR VAPOR TRANSFER OF VERY HIGH PURITY LIQUIDS AT HIGH DILUTION

BACKGROUND OF THE INVENTION

1. Field of the Invention

This invention relates to the deposition of thin layers of chemical material upon a solid substrate. More specifically, this invention relates to the equipment and the method related to such chemical deposition.

2. Description of the Prior Art

The present invention involves a vapor transport system and process for the deposition of solid materials from a gaseous carrier. In the field of this invention, there are a number of patents that pertain to this design. The following list is a compendium of these patents: U.S. Pat. No. 4,006,205 issued to Etter on Feb. 1, 1977, U.S. Pat. No. 4,091,056 issued to Hamalainen, et. al. on May 23, 1978, U.S. Pat. No. 4,105,725 issued to Ross on Aug. 8, 1978, U.S. Pat. No. 4,140,735 issued to Schumacher on Feb. 20, 1979, U.S. Pat. No. 4,235,829 issued to Partus on Nov. 25, 1980, U.S. Pat. No. 4,276,243 issued to Partus on Jun. 30, 1981, U.S. Pat. No. 4,393,013 issued to McMenamin on Jul. 12, 1983, U.S. Pat. No. 4,436,674 issued to McMenamin on Mar. 13, 1984, U.S. Pat. No. 4,450,118 issued to Tain on May 22, 1984, and U.S. Pat. No. 4,582,480 issued to Lynch, et. al. on Apr. 15, 1986.

The present invention concerns an improved liquid source material container and a process for vapor transport of a high purity liquid by a carrier gas. This invention can be used in connection with the manufacture of multi-layer solar cells and compound semi-conductor devices.

BACKGROUND OF THE INVENTION

In the manufacture of multi-layer solar cells or compound semi-conductor devices, electronically active layers or films are deposited from a vapor diluted carrier gas stream by the thermal decomposition of a vapor or mixtures of different liquid vapors and gases at slightly above or at sub-atmospheric pressures. The process of film formation is normally conducted at elevated temperatures in a chemical vapor deposition furnace. The process is described in detail in "VLSI Fabrication Principles—Silicon and Gallium Arsenide" by S. K. Ghandi (John Wiley and Sons, Publishers, 1983) chapter 5.

The vapor transport process can be utilized for several purposes including thin film formation with co-deposition of semiconductor dopants or diffusion of chemical elements into previously deposited thin films or other solid-state materials. Nearly all of these vapor-transported source and dopant liquids are pyrophoric, corrosive and/or toxic and must be maintained in vacuum-tight systems both for maintenance of high liquid purity and for the reduction of health hazard potential.

Typically, for the manufacture of compound semiconductors, a suitable thin solid substrate or wafer such as gallium arsenide or indium phosphide is used as a support for the epitaxial deposition of the thin film. For a gallium arsenide deposition, two separate carrier streams such as hydrogen containing very dilute trimethyl gallium vapor and hydrogen diluted arsine gas are combined in the quartz furnace tube and allowed to pass over the heated substrate. In this process, the reactant vapors and gases must be precisely blended and delivered to the deposition furnace at specified dilute concentration levels. The elevated temperature causes the decomposition of the two gaseous components to produce a thin film of very high purity gallium arsenide. Normally, this process is conducted at slightly above atmospheric pressure, but, for several other types of compound semiconductors, improved control of the thin film characteristics is maintained at sub-atmospheric pressure.

Semiconductor dopants can be simultaneously incorporated during the film formation by maintaining the proper dopant to vapor gas ratio. The dopant level must be maintained at the parts-per-million level in the hydrogen carrier gas stream prior to entry into the quartz furnace tube.

Currently, the commercial process of creating a vapor-saturated carrier gas transport of dopant liquids for silicon semiconductor use is developed through a quartz or Pyrex liquid bubbler arrangement. Acceptable bubbler performance depends upon maintenance of accurate and reproducible vapor delivery rates at saturated levels in a carrier gas having ultra-low levels of impurities. An apparatus and process for such a bubbler arrangement is discussed in U.S. Pat. No. 4,140,735. Such an apparatus, however, is not adaptable nor practical for vacuum or sub-atmospheric pressure due to the danger of implosion and the necessity of a sub-ambient temperature controlled bath for use in compound semiconductor manufacture.

The majority of the epitaxial liquid source and dopant materials for compound semiconductor manufacture have vapor pressures at room temperature (25 degrees Celsius) which develop saturated vapor concentration in a carrier gas that are too high. This high concentration interferes with good film growth and the trace level doping process. Thus, additional and costly refrigerated baths must be used to reduce the saturated vapor pressures for such an arrangement.

Designs for vaporizing liquids with attendant flow control such as found in U.S. Pat. No. 4,091,056 for medical applications are also unsuitable for compound semiconductor manufacturing. The main drawback involves the use of ball-type flow meters. The moving ball and its containment tube are subject to damage from corrosion and erosion producing particulates and chemical contamination. This is highly detrimental to the fabrication of compound thin films. The prior art for vapor mass flow control can be found specifically in U.S. Pat. Nos. 4,436,674 and 4,393,013. These devices require complex and expensive feed-back sensing of pressure and temperature to maintain accurate saturated vapor mass flow control. Thus, they are unsatisfactory in their application to the manufacturing of solar cells.

At this time, the prior art does not yield a satisfactory solution to the problem of developing and controlling a vapor-to-carrier-gas ratio at the low to moderate parts-per-million level for very high purity toxic, pyrophoric and corrosive liquid source materials and dopants for compound semiconductor use. The present invention relates to an improvement thereupon.

SUMMARY OF THE INVENTION

In accordance with the present invention, an improved bubbler arrangement for use at sub-atmospheric pressure is disclosed which achieves a highly diluted vapor concentration at ambient temperature in a carrier gas without the need for refrigeration. The described flow arrangement prevents contamination of the high purity liquid. Additionally, herein disclosed is a convenient shipping and storage container. For very high purity liquids, the bubbler system is normally constructed of quartz surrounded by insulation and an outer metal shell. Alternately, the inner chamber made of quartz may be constructed from other materials such as Pyrex.

The present invention is based on the discovery that a predetermined highly diluted vapor concentration of a liquid at room temperature in a carrier gas can be achieved by splitting the incoming carrier gas within a valve assembly into two flow paths. One of the flow paths is maintained at a very low flow rate by the length and diameter of an entrance tube into the bubbler reservoir. The second much higher flow rate path is maintained by the length and diameter of its flow tubing. The second flow path joins the terminal end of the exit bubbler tube inside a second valve assembly. This creates a large dilution of the vapor saturated low flow rate carrier gas emanating from the exit bubbler tube in the proper ratio. The flow resistance of the two gas flow paths is critical. This is accomplished by proper selection and calibration of the length and diameter of the two flow path tubes. As a result, a proper vapor-to-carrier-gas ratio is developed.

To use the improved bubbler system, a carrier gas, preferably hydrogen, is connected to the entrance valve. The exit valve is connected by means of tubing to the user system. The user system may be a chemical vapor deposition furnace. The pressure of the hydrogen carrier gas is adjusted to the proper operating level and allowed to flow through the entrance valve assembly. The carrier gas flows around the closed stem tip and through the external by-pass tubing to the exit valve. Within the exit valve, the carrier gas flows around its closed stem tip to the user system. This procedure removes any air or moisture in the tubing and valves. After a brief period, the entrance and exit valves are opened and the hydrogen flow rates come to equilibrium through both flow-paths. Flow-rates are created according to the predetermined lengths and diameters of the bubbler system tubing and its by-pass tubing. Small fluctuations in the downstream gas pressure due to valving changes or furnace pressure changes are essentially smoothed out in the capillary flow paths such that both flow rates are effected equally. Thus, the ratio of the two mass flows remains constant.

The operation of the present invention is based on the theory of laminar flow of gases through tubes and the vapor pressures of liquids at known temperatures. A very low carrier gas flow rate (0.1–10 ml/min.) through the liquid assures vapor-liquid equilibrium in the carrier gas. A generalized non-linear expression can be shown as follows:

$$G_v/G_g = K(P_v D_l^4 L_u)/(P_g D_u^4 L_l)$$

where:

$G_v$ = mass flow of the vapor at system temperature (room temperature) in grams/min.

$G_g$ = mass flow of the carrier gas at system temperature in grams/min.

$K$ = a constant dependent upon the molecular weight of the liquid and the molecular weight of the carrier gas, i.e. $MW_l/MW_g$.

$P_v$ = vapor pressure of the liquid at system temperature (atm.)

$P_g$ = inlet pressure of the carrier gas (atm.)

$D_l$ = inside diameter of the bubbler capillary (cm.)

$L_u$ = length of the by-pass capillary tube (cm.)

$D_u$ = inside diameter of the by-pass capillary tube (cm.)

$L_l$ = length of the bubbler capillary tube (cm.)

By proper selection of the parameters in the above expression, a desired vapor-mass-flow-to-carrier-gas-mass-flow ratio can be obtained. One example is provided by a hydrogen carrier gas flow of 10,000 ml/min. (1.05 atm.). 10,000 ml/min. of gas passed through the upper capillary tube and bubbler at a temperature of 25 degrees Celsius for trimethyl gallium yields a corresponding ratio of 6552 ppm (wt./wt.). In order to satisfy the other variables of the equation, a 21.75 in. ×0.063 in. I.D. upper capillary and a 12.6 in ×0.008 in. I.D. bubbler capillary tube were used.

With these and other objects in view which will more readily appear as the nature of the invention is better understood, the invention resides in the novel combination and arrangement of parts and a method for the use of those parts as hereinafter more fully described and illustrated, with reference being made to the accompanying drawings.

BRIEF DESCRIPTION OF THE DRAWINGS

Similar reference characters designate corresponding parts throughout the various figures of the drawings.

DESCRIPTION OF THE PREFERRED EMBODIMENT

Figure 1:
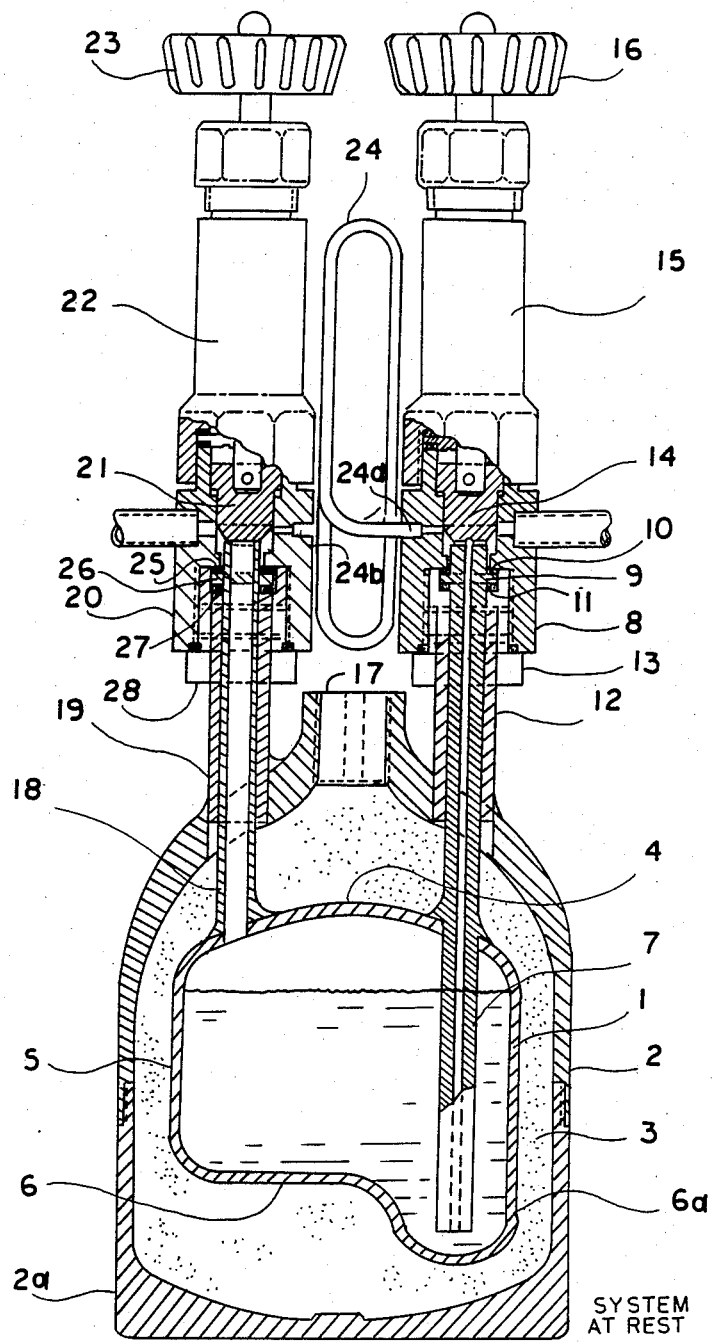
FIG. 1 is a cross-sectional view of the bubbler system showing the internal components at rest. The system is in a closed position.

The apparatus is made of a cylindrical quartz inner chamber 1 surrounded by a two section outer cylindrical metal chamber, upper section 2 and lower section 2a. The two section outer cylindrical metal chamber 2 and 2a is joined at the midsection in a conventional manner. The conventional manner of the joining of the halves of the outer cylindrical metal chamber 2 and 2a may be accomplished by a weld joint or other suitable means. The interstitial space 3 between the cylindrical quartz inner chamber 1 and outer cylindrical metal chamber 2 and 2a is filled with an expandable polymeric foam or similar material. The insulation is introduced through a removable plug 17. The cylindrical quartz inner chamber 1 includes a top wall 4, a cylindrical side wall 5, a bottom wall 6, and a bottom well 6a.

Penetrating through and fused to the top wall 4 is an elongated quartz inlet tube 7 with a calibrated narrow bore terminating in the bottom well 6a. The top of the elongated quartz inlet tube 7 extends into the metal inlet valve assembly 8. The metal inlet valve assembly 8 is designed and manufactured specifically for the handling of gaseous materials.

Near the top of the elongated quartz inlet tube 7, there is a solid quartz inlet rim 9 formed as a part of the superior portion of the elongated quartz inlet tube 7. The elongated quartz inlet tube 7 is attached at the quartz inlet rim 9 to the metal inlet valve assembly 8 by means of a vacuum-tight compression seal. The vacuum-tight compression seal is formed by means of a conventional upper O-ring or gasket 10, solid quartz inlet rim 9, conventional lower O-ring or gasket 11, elongated quartz inlet tube metal sleeve 12, and a threaded compression nut 13. The elongated quartz inlet tube metal sleeve 12 is joined and secured to the outer cylindrical metal chamber, upper section, 2 by a weld or similar method.

The upper end of the elongated quartz inlet tube 7 can be closed or opened by a bellows high vacuum-type inlet valve assembly 15. The inlet valve assembly has a sliding inert inlet polymeric plug 14 which is moved by means of the rotary handle 16. The inert inlet polymeric plug 14 functions to open or close the path to the elongated quartz inlet tube 7. The bellows inlet valve assembly 15 is attached to the metal inlet valve assembly 8 by means of a weld or its equivalent.

The elongated quartz outlet tube 18 with medium bore is attached and fused at its inferior portion to the top wall 4 and extends through the elongated quartz outlet tube metal sleeve 19 to metal outlet valve assembly 20. The elongated quartz outlet tube metal sleeve 19 is attached and secured to the outer cylindrical metal chamber, upper section 2, by means of a weld or its equivalent. The elongated quartz outlet tube 18 is attached to the metal outlet valve assembly 20 by means of a compression seal. The compression seal is formed by means of a conventional upper O-ring or gasket 25, quartz outlet rim 26, lower conventional O-ring or gasket 27, elongated quartz outlet tube metal sleeve 19, and a threaded compression nut 28. The calibrated elongated quartz outlet tube 18 is closed or opened by another bellows high vacuum-type outlet valve assembly 22 having a sliding inert outlet polymeric plug 21. The inert outlet polymeric plug 21 is raised or lowered by means of the rotary handle 23.

Connected and secured in a permanent manner to the inlet valve third port 24a on the metal inlet valve assembly 8 is an elongated length of metal capillary tubing 24. This metal capillary tube 24 may also be referred to as by-pass tube, because it bypasses the flow path through the closed inner chamber 1. The other end of the metal capillary tubing 24 is connected and secured to the outlet valve third port 24b of the outlet valve assembly 20. This elongated metal capillary tube 24 constitutes a by-pass flow path for the carrier gas.

OPERATION

After connecting the apparatus to the using system, a carrier gas, typically hydrogen, is applied to the apparatus through the metal inlet valve assembly 8. The carrier gas flows around the inert inlet polymeric plug 14, through the calibrated metal capillary tube 24, around the inert outlet polymeric plug 21, and on to the using system. The net effect of such a flow path is to create a system purge. Purging the system before use effectively removes any air and moisture that may have accumulated in the tubing and valves.

Figure 2:
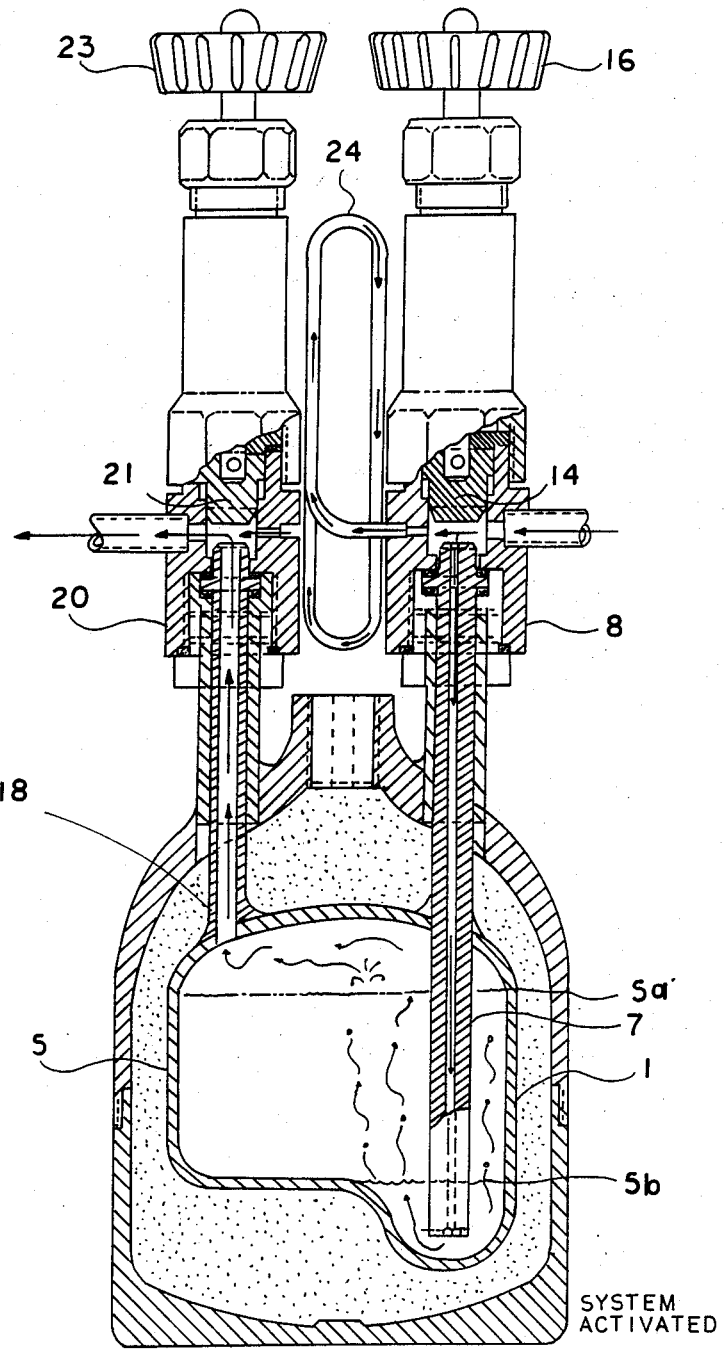
FIG. 2 is a cross-sectional view of the bubbler system in operation with the carrier gas shown flowing through both flow paths.

FIG. 2 indicates the system in operation. With the carrier gas flowing during a purge, the inlet polymeric plug 14 is lifted from the top end of the elongated quartz inlet tube 7 by means of inlet rotary valve handle 16. Sequentially, the inert outlet polymeric plug 21 is lifted from the top end of the elongated quartz outlet tube 18 by means of outlet rotary valve handle 23. With both valves open, the carrier gas divides into two separate flow paths within the metal inlet valve assembly 8 according to the resistance of each flow path. The length and diameter of the metal capillary tube 24, the capillary elongated quartz inlet tube 7, and the elongated quartz outlet tube 18 are initially calibrated to develop the proper flow in each flow path. In an alternate embodiment, a disk of predetermined thickness with a hole of predetermined diameter bored therethrough may be placed at the upper portion of both the elongated quartz inlet tube 7 and the elongated quartz outlet tube 18. The disk will serve the same function as the selection of the appropriate tube diameter and length. A small fraction of the carrier gas flows through the elongated quartz inlet tube 7 emerging as bubbles through the liquid contained in the cylindrical quartz inner chamber 1. Due to the very low flow, the carrier gas bubbles becomes vapor saturated upon passing through the liquid at ambient temperatures. The liquid level 5a in the cylindrical quartz inner chamber 1 must be greater than the minimum path length 5b required to insure vapor saturation of the carrier gas. The vapor saturated carrier gas exits through the elongated quartz outlet tube 18 and recombines with the carrier gas from the metal capillary tubing 24 within outlet valve assembly 20. The vapor saturated carrier gas is diluted by this combination with the carrier gas from the metal capillary tubing 24. The vapor diluted carrier gas exits from outlet valve assembly 20 to the using system.

It is to be understood that the present invention is not limited to the sole embodiment described above, but encompasses any and all embodiments within the scope of the following claims.

I claim:
1. A bubbler system allowing for the bubbling of a carrier gas that is not exposed to the atmosphere through a liquid at ambient temperature having a chemical composition essentially uniform to develop a carrier gas stream having a predetermined dilute vapor-to-gas ratio comprising:
   a carrier gas source external to said bubbler system;
   a liquid having a chemical composition essentially uniform allowing for the liquid vapor enhancement of said carrier gas;
   a using system external to said bubbler system allowing for the use of said carrier gas once enhanced;
   a primary container composed of a closed inner chamber surrounded and enclosed by a closed outer chamber allowing for the containment of said liquid having chemical composition essentially uniform, the closed inner chamber having a bottom well;
   an inlet valve externally located to said primary container allowing for the importation of said carrier gas into said closed inner chamber of said bubbler system;
   an outlet valve externally located to said primary container allowing for the exportation of said carrier gas enhanced by the saturation vapor of said liquid having a chemical composition essentially uniform within said closed inner chamber of said bubbler system to said system;
   an inlet tube extending from the inferior portion of said inlet valve to the superior portion of said inner chamber and passing to said bottom well of said closed inner chamber allowing for flow of the carrier gas entering near the upper portion of said inlet tube and passing into said closed inner chamber;
   an inlet tube protective sleeve surrounding said inlet tube and extending from the inferior portion of said inlet valve to said closed outer chamber;
   an outlet tube extending from the inferior portion of said outlet valve to the superior portion of said closed inner chamber allowing for flow of said carrier gas exiting from the upper portion of said outlet tube and passing from said closed inner chamber;

a by-pass tube of predetermined length and diameter connecting a peripheral port from said inlet valve to a peripheral port of said outlet valve allowing for the transportation of a stream of said carrier gas in order to equalize the flow of said carrier gas from said inlet tube to said outlet tube.

2. A bubbler system primary container according to claim 1 wherein,
said closed inner chamber has a bottom well placed asymmetrically at its inferior portion;
said closed outer chamber surrounds said closed inner chamber allowing for the protection of said closed inner chamber; and
insulation is placed between the outer wall of said closed inner chamber and the inner wall of said closed outer chamber.

3. A bubbler system inlet tube according to claim 1 wherein,
said inlet tube is attached at its superior portion to said inlet valve by a compression seal and is attached radially at least at one point along its length to the superior portion of said closed inner chamber;
said inlet tube at its inferior portion terminates near said bottom well of said closed inner chamber;
said inlet tube is surrounded in part by an inlet tube protective sleeve attached to the superior portion of said closed outer chamber and extending to the inferior portion of said inlet valve.

4. A bubbler system inlet tube according to claim 1 wherein,
said inlet tube being of predetermined length and diameter extending from the inferior portion of said inlet valve to the superior portion of said inner chamber and passing to said bottom well of said closed inner chamber allowing for flow restriction of the carrier gas entering near the upper portion of said inlet tube and passing into said closed inner chamber.

5. A bubbler system inlet tube according to claim 1 wherein,
said inlet tube including an inlet flow control disc having a predetermined thickness and a hole of predetermined diameter bored therethrough placed at said inlet tube upper portion allowing for the flow restriction of the carrier gas entering near the upper portion of said inlet tube and passing into said closed inner chamber.

6. A bubbler system outlet tube according to claim 1 wherein,
said outlet tube attached at one end to the superior portion of said closed inner chamber and whose opposing end is attached to the inferior end of said outlet valve;
said outlet tube surrounded by a protective sleeve being attached to the superior portion of said closed outer chamber and extending to the inferior portion of said outlet valve where it is attached.

7. A bubbler system outlet tube according to claim 1 wherein,
said outlet tube being of predetermined length and diameter extending from the inferior portion of said outlet valve to the superior portion of said closed inner chamber allowing for flow restriction of said carrier gas exiting from the upper portion of said outlet tube and passing from said closed inner chamber.

8. A bubbler system outlet tube according to claim 1 wherein,
said outlet tube including an outlet flow control disc having a predetermined thickness and a hole of predetermined diameter bored therethrough placed at said outlet tube upper portion allowing for flow restriction of said carrier gas exiting from the upper portion of said outlet tube and passing from said closed inner chamber.

9. A bubbler system outlet valve according to claim 1 wherein,
said outlet valve including three openings;
said outlet valve having one opening joined to the superior portion of said outlet tube by means of a compression seal;
said outlet valve having a movable shaft and soft stem tip allowing for the closing of said outlet tube;
said outlet valve having a second and third opening placed on the periphery of the said outlet valve;
said second opening has a metal tube attached allowing for the connection to said using system;

10. A bubbler system inlet and outlet valve according to claim 1 wherein:
said inlet valve and said outlet valve are conventional two port high-vacuum valves;
said inlet valve includes an entrance tee tube junction allowing for the connection with said carrier gas source;
the primary port of said entrance tee tube is connected to the superior portion of said inlet tube of said closed inner chamber;
said outlet valve includes an exit tee tube junction allowing for the connection with said carrier gas source;
the primary port of said exit tee tube junction is connected to the superior portion of said outlet tube of said closed inner chamber;
said inlet and outlet valves may be closed to seal said primary container during shipment.

11. A bubbler system according to claim 1 wherein:
said primary container can be alternately heated allowing for the increase in the vapor pressure of said liquid whose composition is essentially uniform.

12. A bubbler system according to claim 1 wherein:
said inner closed chamber can be evacuated allowing for the operation of said bubbler system at subatmospheric pressure.

13. A bubbler system according to claim 1 wherein:
the liquid level of said liquid whose composition is essentially uniform can be monitored and recorded.

14. A bubbler system inlet valve according to claim 1 wherein,
said inlet valve includes three openings;
said inlet valve has one opening joined to the superior portion of said inlet tube and said inlet tube protective sleeve by means of a compression seal;
said inlet valve has a movable shaft connected to a soft stem tip allowing for the opening and closing of said inlet tube by the movement of said soft stem tip either away from or in contact with the superior portion of said inlet tube;
said second and third openings are placed on the periphery of said inlet valve;
said second opening has a metal tube attached allowing for the connection to said carrier gas source.

15. A bubbler system by-pass tube according to claim 14 wherein,
  said by-pass tube secured to and extending from said third opening of said inlet valve;
  said by-pass tube terminating and attached to said third opening of said outlet valve;
  said by-pass tube having a predetermined length and diameter for flow restriction.

16. A method for preparing said dilute vapor-to-gas ratio without using refrigeration utilizing the bubbler system of claim 1 comprising the steps of:
  ducting the dry carrier gas of the primary flow path at a slow flow rate into said closed inner chamber;
  bubbling said dry carrier gas upwardly through a quantity of said liquid whose composition is essentially uniform within said closed inner chamber and transporting said liquid in vapor form through the head space above the level of said liquid;
  ducting said dry carrier gas saturated with the vapor from said liquid whose composition is essentially uniform out of said closed inner chamber through said outlet tube;
  ducting said dry carrier gas through said by-pass tube at a high flow rate;
  exiting said dry carrier gas saturated with the vapor of said liquid from said closed inner chamber into said outlet valve;
  mixing and diluting same with the high flow rate dry carrier gas coming from said by-pass tube;
  said vapor-gas mixture resulting in a predetermined very dilute vapor-to-gas ratio.

17. A method according to claim 16 wherein the following conditions are further followed:
  the initial depth of said liquid is at least as great as required to saturate said dry carrier gas as it is bubbled upwardly through said liquid;
  discontinuing the flow of said dry carrier gas before the level of said liquid having a composition essentially uniform falls below the inferior portion of said inlet tube.

* * * * *